(12) United States Patent
Sakashita et al.

(10) Patent No.: US 11,534,886 B2
(45) Date of Patent: Dec. 27, 2022

(54) POLISHING DEVICE, POLISHING HEAD, POLISHING METHOD, AND METHOD OF MANUFACTURING SEMICONDUCTOR DEVICE

(71) Applicant: KIOXIA CORPORATION, Tokyo (JP)

(72) Inventors: Mikiya Sakashita, Nagoya Aichi (JP); Yukiteru Matsui, Nagoya Aichi (JP); Akifumi Gawase, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 410 days.

(21) Appl. No.: 16/806,558

(22) Filed: Mar. 2, 2020

(65) Prior Publication Data

US 2021/0170542 A1 Jun. 10, 2021

(30) Foreign Application Priority Data

Dec. 10, 2019 (JP) .............................. JP2019-222695

(51) Int. Cl.
*B24B 37/20* (2012.01)
*B24B 37/04* (2012.01)
*H01L 21/306* (2006.01)
*H01L 21/67* (2006.01)

(52) U.S. Cl.
CPC ............ *B24B 37/20* (2013.01); *B24B 37/042* (2013.01); *H01L 21/30625* (2013.01); *H01L 21/67253* (2013.01); *H01L 21/67259* (2013.01)

(58) Field of Classification Search
CPC . B24B 37/20; B24B 37/042; H01L 21/30625; H01L 21/67253; H01L 21/67259
See application file for complete search history.

(56) References Cited

U.S. PATENT DOCUMENTS

| 6,722,962 | B1 | 4/2004 | Sato |
| 7,048,621 | B2 * | 5/2006 | Chen ..................... B24B 37/005 451/398 |
| 7,357,695 | B2 * | 4/2008 | Elledge .................. B24B 49/16 451/21 |
| 2004/0029333 | A1 | 2/2004 | Matsukawa |
| 2006/0186499 | A1 | 8/2006 | Maeda et al. |
| 2007/0184759 | A1 * | 8/2007 | Lee ......................... B24B 21/08 451/41 |
| 2008/0146119 | A1 | 6/2008 | Sasaki et al. |
| 2008/0248723 | A1 | 10/2008 | Yokoyama et al. |
| 2008/0268751 | A1 | 10/2008 | Yokoyama et al. |

(Continued)

FOREIGN PATENT DOCUMENTS

| CN | 104924198 A | 9/2015 |
| JP | H08288245 A | 11/1996 |

(Continued)

*Primary Examiner* — Syed I Gheyas
(74) *Attorney, Agent, or Firm* — Kim & Stewart LLP

(57) ABSTRACT

According to one embodiment, a polishing apparatus includes a holder for holding a polishing pad for polishing a surface of a substrate. A plurality of pressing members are configured to press a back surface side of the polishing pad while held by the holder. A driving unit is configured to selectively move pressing members in a direction towards the surface of the substrate so as to press the back surface side of the polishing pad.

20 Claims, 12 Drawing Sheets

(56) References Cited

U.S. PATENT DOCUMENTS

| | | | |
|---|---|---|---|
| 2012/0244787 A1* | 9/2012 | Seki | B24B 21/008 |
| | | | 451/303 |
| 2013/0040456 A1 | 2/2013 | Eda et al. | |
| 2015/0266159 A1 | 9/2015 | Shiokawa | |
| 2016/0001418 A1 | 1/2016 | Terada | |
| 2017/0239784 A1* | 8/2017 | Kamimura | B24B 47/00 |
| 2017/0368661 A1 | 12/2017 | Nakamura | |

FOREIGN PATENT DOCUMENTS

| | | |
|---|---|---|
| JP | 2002219645 A | 8/2002 |
| JP | 2006263903 A | 10/2006 |
| JP | 2008528300 A | 7/2008 |
| JP | 2008258510 A | 10/2008 |
| JP | 2008277450 A | 11/2008 |
| JP | 5767898 B2 | 8/2015 |
| JP | 2018001296 A | 1/2018 |
| WO | 2014128754 A1 | 8/2014 |

* cited by examiner

POLISHING DEVICE, POLISHING HEAD, POLISHING METHOD, AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2019-222695, filed Dec. 10, 2019, the entire contents of which are incorporated herein by reference.

FIELD

Embodiments described herein relate generally to a polishing device, a polishing head, a polishing method, and a method of manufacturing a semiconductor device.

BACKGROUND

In a manufacturing process of a semiconductor device, planarization techniques for surfaces of the semiconductor device are increasingly important. An important technique among the available planarization techniques is chemical mechanical polishing (CMP). Chemical mechanical polishing brings a substrate, such as a semiconductor wafer, into contact with a polishing surface, such as polishing pad. The polishing occurs while a polishing liquid containing abrasive grains such as silica ($SiO_2$) is supplied onto the surfaces being polished.

DETAILED DESCRIPTION

Figure 1:
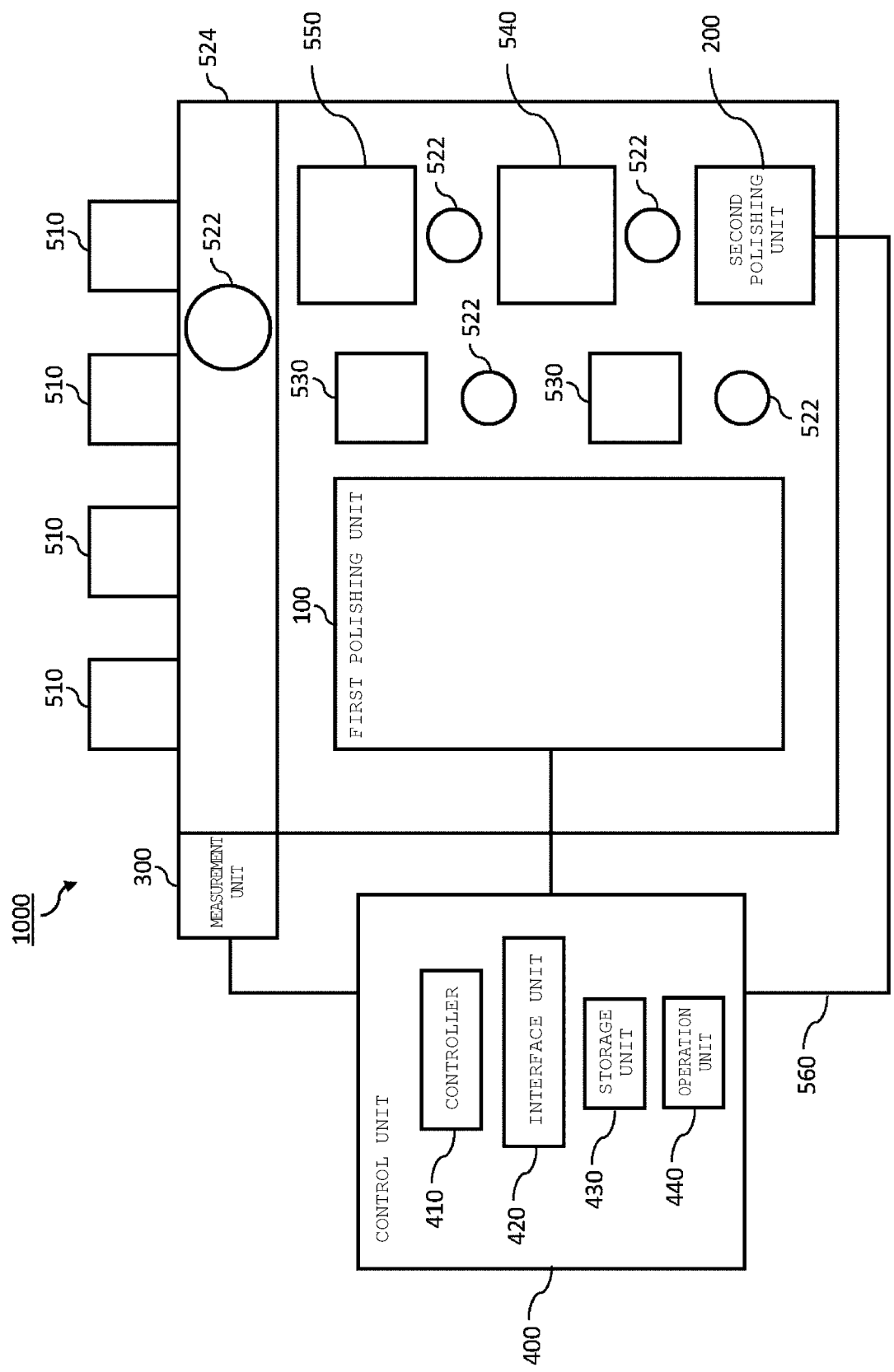
FIG. 1 is a diagram depicting components of a polishing device according to an embodiment.

Various disclosed embodiments concern modifying a film thickness on a substrate at high speed and with high accuracy by controlling the region of contact between a polishing target film on the substrate and a polishing surface, such as a polishing pad.

In general, according to one embodiment, a polishing apparatus includes a holder configured to hold a polishing pad for polishing a surface of a substrate. A plurality of pressing members are used to press a back surface side of the polishing pad while it is being held by the holder. A driving unit is configured to selectively move pressing members in a direction towards the surface of the substrate so as to press the back surface side of the polishing pad while it is being held by the holder. The selective movement of the pressing members can be utilized to vary the contact between the polishing pad and the substrate for polishing.

Hereinafter, examples of a polishing head and a polishing device according to certain embodiments will be described with reference to the drawings. In general, the drawings are schematic, the depicted relationship(s) between various dimensions of components, such as thickness and planar area, ratios of the thicknesses of each depicted layer, or the like may be different from those in actual samples, devices, or the like. In addition, in the drawings, those components or aspect that are substantially the same are denoted by the same reference numerals in the various figures, and repeated description thereof may be omitted.

FIG. 1 is a diagram showing components of a polishing device 1000 according to an embodiment and an example of an arrangement relationship thereof. The polishing device 1000 includes a first polishing unit 100, a second polishing unit 200, a measuring device 300, a control unit 400, a load port 510, a conveyance robot 522, a conveyance path 524, a substrate station 530, a cleaning unit 540, a drying unit 550, and a bus 560.

The control unit 400 communicates with the first polishing unit 100, the second polishing unit 200, and the measuring device 300 via the bus 560. A plurality of conveyance robots 522 are provided to transport substrates (e.g., wafers) between the first polishing unit 100, the second polishing unit 200, the measuring device 300, the load port 510, the cleaning unit 540, and the drying unit 550 as needed.

Figure 2:
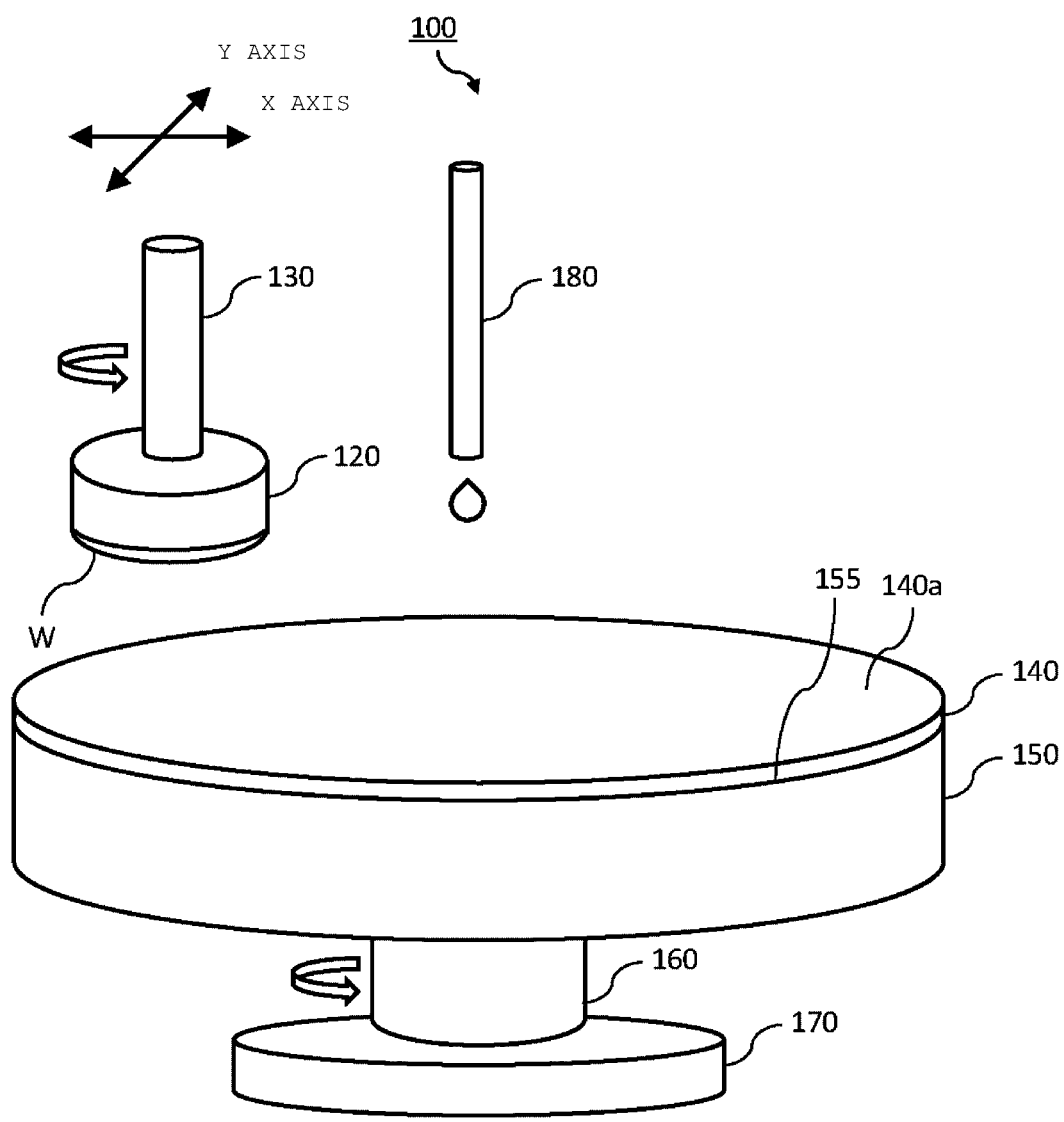
FIG. 2 depicts a first polishing unit of a polishing device according to an embodiment.

FIG. 2 is a perspective view showing a configuration example of the first polishing unit 100 of the polishing device 1000 according to the present embodiment. The first polishing unit 100 has a table 150 that supports a polishing pad 140, a top ring 120 that presses a wafer W against the polishing pad 140, and a nozzle 180 that supplies slurry (also referred to as polishing abrasive) on to the polishing pad 140.

In the first polishing unit 100, the top ring 120 is mounted so that a polishing target surface of the wafer W is downward facing (face-down) with respect to a surface plate 155 on upward facing side the table 150 on to which the polishing pad 140 is attached. The surface plate 155 may also be referred to as a platen. The top ring 120 (and also a top ring 220 described later) may also be referred to as a polishing head.

The table 150 is connected to a table motor 170 via a table shaft 160. The table motor 170 rotates the table 150 in the direction indicated by the curved arrow in FIG. 2. The polishing pad 140 is attached to a upper surface of the table 150, and the upper surface of the polishing pad 140 constitutes a polishing surface 140a for polishing a wafer W. The polishing surface 140a has a larger planar area than the wafer W, such that the entire surface of the wafer W may simultaneously contact the polishing surface 140a.

The top ring 120 is fixed to a lower end of a top ring shaft 130. The top ring 120 may hold the wafer W on the lower surface thereof by vacuum suction or otherwise.

In the following description, the wafer W may be referred to as a substrate W. In addition, the polishing pad 140 (and a polishing pad 240 described later) may be referred to as a polishing cloth.

The target surface of the wafer W is polished as follows. In response to a command from the control unit 400, the top ring 120 and the table 150 rotate in directions indicated by the respective curved arrows in FIG. 2. The top ring 120 presses a surface of the wafer W (for example, a surface on which a wiring pattern has been formed) against the polishing surface 140a. The slurry is supplied from the nozzle 180 onto the polishing surface 140a during this process. The surface of the wafer W is polished by a combination of chemical action (chemical reactions involving the chemical components in the slurry) and mechanical action (primarily by abrasive grains in the slurry). The polishing of the surface of the wafer W is controlled by an operation command signal from a controller 410. In some examples, the rotation directions of the top ring 120 and the table 150 may be opposite to the directions indicated by the curved arrows in FIG. 2. In addition, the top ring 120 and the table 150 may rotate in the same or opposite directions from each other.

Figure 3:
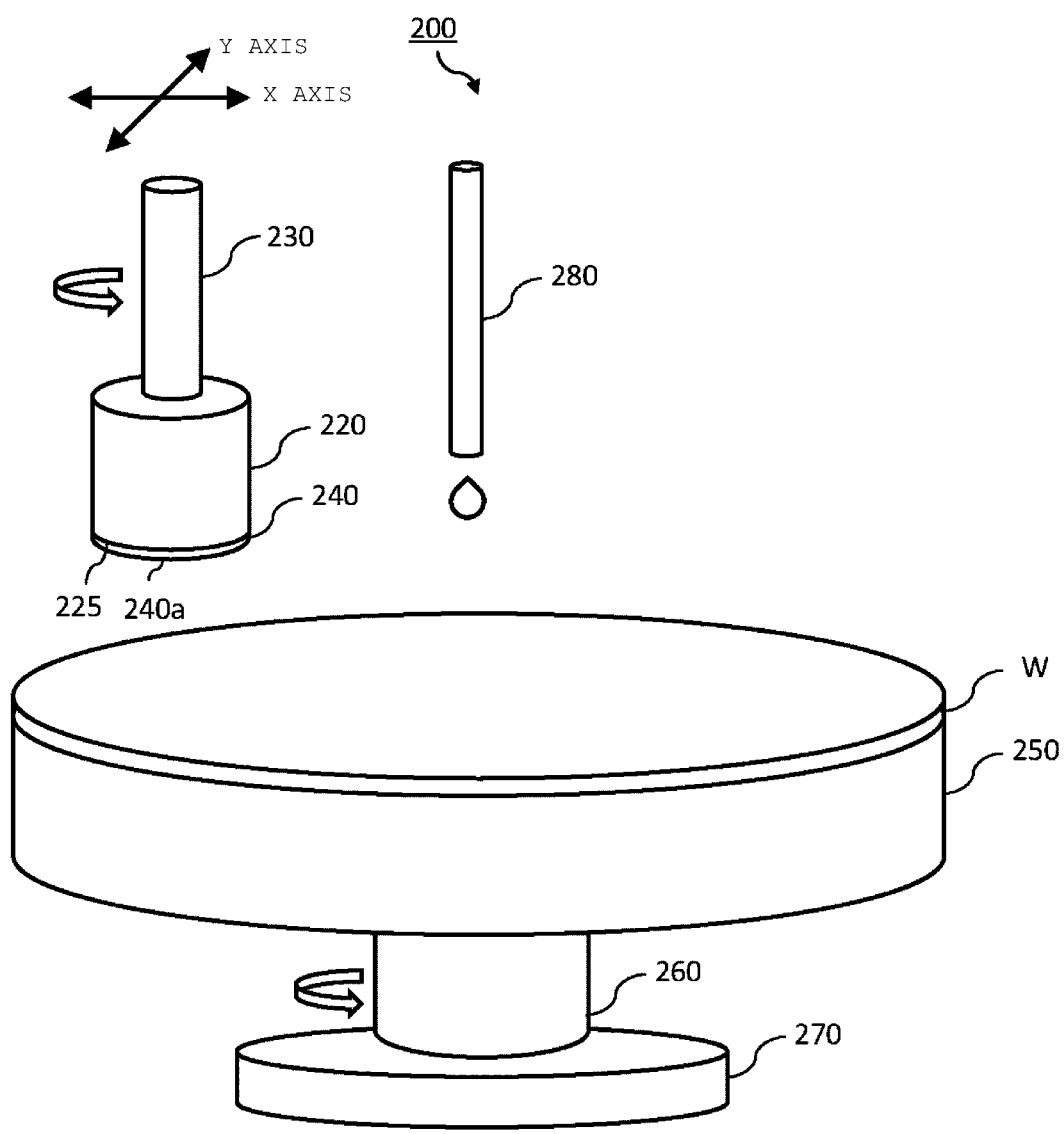
FIG. 3 depicts a second polishing unit of a polishing device according to an embodiment.

FIG. 3 is a perspective view showing a configuration example of the second polishing unit 200 of the polishing device 1000 according to the present embodiment. The second polishing unit 200 includes a table 250, a top ring 220 that presses the polishing pad 240 against the wafer W, and a nozzle 280 for supplying slurry to the wafer W. The top ring 220 is fixed to a lower end of a top ring shaft 230. The polishing pad 240 is mounted so as to be in contact with a pressing member 294 (see, e.g., FIG. 4) via a mounting unit 225 below the top ring 220 (also referred to as a holder 220), and a lower surface of the polishing pad 240 constitutes a polishing surface 240a for polishing the wafer W.

The table 250 is connected to a table motor 270 disposed below a table shaft 260 via the table shaft 260. The table motor 270 rotates the table 250 in a direction indicated by the arrow.

The second polishing unit 200 mounts the polishing target surface of the wafer W on the table 250 facing upward (face-up). A variation in substrate film thickness may be referred to as an undulation or an uneven portion. The planar area of the mounting surface of the table 250 is slightly larger than a planar surface area of the wafer W. In a common processing scenario, the wafer W is a disk shape with a diameter of about 12 inches (approximately 300 mm), and the second polishing unit 200 is typically smaller than the first polishing unit 100.

The top ring 220 on which the polishing pad 240 is mounted presses the polishing pad 240 against the surface of the wafer W. As depicted in FIG. 3, the top ring 220 is smaller in size than the wafer W. In other words, the planar area of the polishing pad 240 is less than the planar area of the surface of the wafer W. Therefore, the polishing pad 240 is mounted on the top ring 220 does not contact the entire surface of the wafer W at once, but rather only locally contacts and polishes the wafer W surface. The top ring 220 rotates the polishing pad 240 in the direction indicated by the curved arrow, and contacts the wafer for a predetermined time. Furthermore, the top ring 220 can move the polishing pad 240 horizontally by predetermined distances along the X and Y axes, and thus polish different portions of the wafer surface over time. In this example, the top ring 220 sequentially polishes the entire wafer W surface by moving the polishing pad 240 in the X and Y axis directions. The horizontal movement of the top ring 220 is controlled by an operation command signal from the controller 410. The rotation direction of the top ring 220 and the table 250 may be opposite to the direction indicated by the arrow in FIG. 3. In addition, the top ring 220 and the table 250 may rotate in the same or different directions.

In some examples, the top ring 220 may polish a predetermined portion of the wafer W surface for a predetermined time or amount, and then be lifted (separated) from the wafer W surface and horizontally moved to polish a different portion of the wafer W.

The nozzle 280 that supplies slurry to the contact surface is disposed in the vicinity of the top ring 220, and this nozzle 280 supplies slurry while moving in synchronization with the movement of the top ring 220. As described above, by synchronizing the movement of the nozzle 280 with the movement of the top ring 220, it is possible to efficiently supply the slurry to the contact surface.

The measuring device 300 is provided with a film thickness sensor capable of measuring the film thickness of a polishing target film on the wafer W. As the film thickness sensor, an eddy current sensor, an optical sensor, a contact sensor, or other known sensor types may be used. In this context, an optical sensor is a device that measures a film thickness by analyzing reflected light from the surface of the substrate. A contact sensor is a device that measures the distribution of uneven portions (e.g., surface roughness) on the surface of the polishing target film on the wafer W by scanning the wafer W surface with a contact probe touching the surface of the wafer W and monitoring the vertical movement of the probe. The contact probe may be referred to as a profilometer in some instances. In the present embodiment, the measuring device 300 can be provided independently of the first polishing unit 100, the second polishing unit 200, and the control unit 400 rather than as an integrated component of any of these other units. However, in some examples, the measuring device 300 may be incorporated in the second polishing unit 200.

The control unit 400 includes a controller 410, an interface unit 420, a storage unit 430, and an operation unit 440. The control unit 400 receives a measurement result related to the film thickness of the polishing target film on the wafer W from the measuring device 300. Next, the control unit 400 calculates parameters related to the surface state of the wafer W based on the received measurement result, and selects a processing condition (or processing conditions) according to the surface state of the wafer W. In addition, the control unit 400 transmits the selected condition(s) to the second polishing unit 200 as an operation command signal.

In the following description, the processing condition(s) may be referred to as a recipe. In this context, recipe refers to control data corresponding to a series of processing parameters to be utilized when the wafer W is polished. For example, the recipe includes a setting (control parameter) that determine the contact region between the polishing pad 240 and the wafer W, a rotational speed of the top ring 220, a load at which the top ring 220 presses the wafer W, a swing distance of the top ring 220, and the like.

Examples of the information used for determining the contact region between the polishing pad 240 and the wafer W include parameters such as the type of the polishing pad 240 being used, a depth of the pressing by a pressing member 294 (see FIG. 4), and how many and which subportions of the pressing member 294 are to be driven/extended.

In various examples, the control unit 400 may be outside of the polishing device 1000, for example, an external computer connected by a communication network to the polishing device 1000. In some examples, the control unit 400 may be incorporated in the second polishing unit 200. In the present embodiment, the control unit 400 is connected to the first polishing unit 100, the second polishing unit 200, and the measuring device 300 via the bus 560.

The controller 410 is provided with a central processing unit (CPU), and controls the first polishing unit 100, the second polishing unit 200, the load port 510, the conveyance robot 522, the conveyance path 524, the cleaning unit 540, and the drying unit 550. As an example of control, an operation command signal based on a condition (recipe) selected by the operation unit 440 is transmitted to the second polishing unit 200.

The interface unit 420 includes, for example, a keyboard by which a process manager (e.g., an operator or other user) inputs commands to manage the polishing device 1000, a display on which control data, operating status, and other information related to operations of the polishing device 1000 can be presented, and the like.

The storage unit 430 stores a history file or the like, such as a recipe table including one or more recipes suitable according to settings by the user for an arbitrary allowable range for the film thickness and the surface state of the polishing target film on the wafer W. The allowable range is an arbitrary setting by the user. For example, the allowable range may be set by the user so as to reflect a margin of error that is within ±5% from a target value for the film thickness. The target value may also be an arbitrary setting regarding the film thickness or the like. The storage unit 430 is a storage device such as a read only memory (ROM) and a random access memory (RAM).

As the recipe, a recipe stored in a non-transitory computer-readable storage medium (for example, hard disk, CD, flexible disk, semiconductor memory) may be used, or a recipe transmitted/downloaded as needed from other devices via network connection or the like. A freely selected recipe may be called from the storage unit 430 as necessary by an instruction from the interface unit 420. In addition, the controller 410 may perform desired processing in the second polishing unit 200 under the control of the controller 410 by executing the freely selected recipe.

The operation unit 440 calculates information related to the surface state of the wafer W from the measurement result related to the film thickness of the polishing target film received from the measuring device 300. In addition, a process condition (recipe) is selected from the storage unit 430 based on the calculation result. Examples of information related to the surface state of the wafer W include a position, width, height, and the like of a portion (e.g., a projection portion P) where the film thickness of the polishing target film on the wafer W exceeds an allowable range. The target polishing amount in a polishing target region of the wafer W may be obtained and set by the operation unit 440.

The load port 510 is a place where a FOUP (front opening universal pod) or a cassette accommodating the wafer W is placed. The wafer W is taken out of the FOUP or cassette by a conveyance robot 522, and is first carried into the first polishing unit 100 via a substrate station 530. In FIG. 1, four load ports 510 are shown, but this number is not a limitation and any number of load ports 510 may be utilized.

A conveyance robot 522 conveys the wafer W to and from each of the first polishing unit 100, the second polishing unit 200, the measuring device 300, the load port 510, the cleaning unit 540, and the drying unit 550. The wafer W may be conveyed to one of the substrate stations 530 as necessary according to availability of various processing units. A conveyance robot 522 has, for example, a hand that holds the wafer W. In addition, the conveyance path 524 comprises a rail or a travel guide along which a conveyance robot 522 may move. A conveyance robot 522 carries the wafer W to each of the first polishing unit 100, the second polishing unit 200, the measuring device 300, the load port 510, the cleaning unit 540, and the drying unit 550 in response to an operation command signal from the controller 410. In addition, a conveyance robot 522 removes the wafer W from each of the first polishing unit 100, the second polishing unit 200, the measuring device 300, the load port 510, the cleaning unit 540, and the drying unit 550 in response to an operation command signal from the controller 410.

A substrate station 530 is a place where the wafers W can be temporarily stored during processing. A substrate station 530 may be provided with a plurality of cassettes that accommodate wafers W.

The cleaning unit 540 cleans the wafer W after the polishing by either the first polishing unit 100 or the second polishing unit 200. The cleaning unit 540 is, for example, a rolling sponge type cleaning machine that brings two rolling sponges into contact with the two (front and back) surfaces of the wafer W while rotating the sponges. The cleaning unit 540 may instead be a pen sponge type cleaning machine that brings a pen type sponge into contact with the surface of the wafer W while rotating the pen type sponge.

The drying unit 550 dries the wafer W after the cleaning by the cleaning unit 540. For example, the drying unit 550 moves nozzles along the surface of the wafer W while supplying an IPA vapor (mixture of isopropyl alcohol and N2 gas) and/or pure water. The drying unit 550 may be a spin dryer that rotates the wafer W at a high speed.

Figure 4:
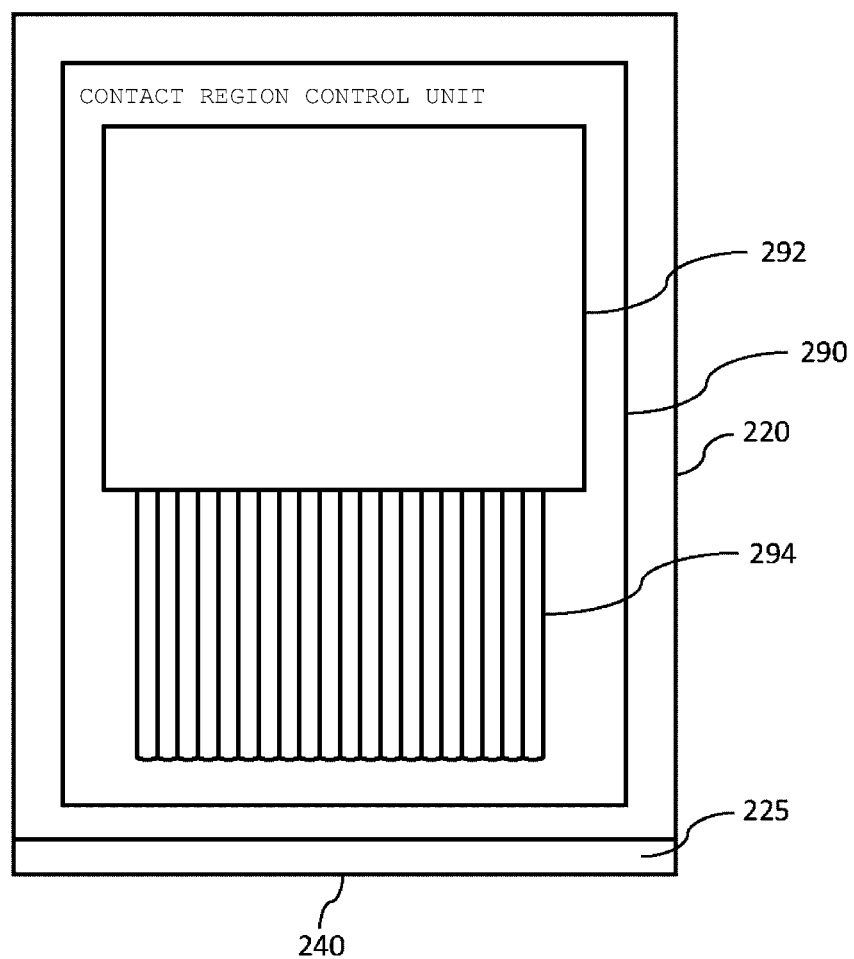
FIG. 4 is a cross-sectional view of a second polishing unit of a polishing device according to an embodiment.

FIG. 4 is a cross-sectional view showing a configuration example of the second polishing unit 200 of the polishing device 1000 according to the present embodiment. The second polishing unit 200 includes a contact region control unit 290 having a driving unit 292 and a plurality of pressing members 294 inside the top ring 220. The contact region control unit 290 controls the size of a contact region between the polishing pad 240 and the wafer W.

The driving unit 292 extends the particular pressing members 294 corresponding to those identified in the recipe in a direction perpendicular to the polishing surface 240a based on the operation command signal from the controller 410. The pressing members 294 press the back surface side of the polishing pad 240 that is being held by the mounting unit 225.

The selection of pressing members 294 controls the shape of the polishing surface 240a of the polishing pad 240 that comes into contact with the projection portion(s) P (see e.g., FIGS. 5-9) on the wafer W. Each pressing member 294 may be a rod-like member connected to movement controller such as an electrical actuator or an air cylinder. Each of the pressing members 294 can be assigned an identification number and these identification numbers can be referenced in the control recipes to designate which if any of the pressing members 294 should be extended. Since a tip end of the pressing member 294 comes into contact with the wafer W via the polishing pad 240, in general, a rounded end shape is preferable. In addition, the diameter of the pressing member 294 is preferably small so as to permit the contact region to be controlled more precisely.

As another method of controlling the contact region of the polishing pad 240, an airbag, airbags, or the like may be used instead of the pressing members 294. In some examples, a sensor may be provided on the table 250 to detect that the polishing pad 240 and the wafer W are in contact with each other. In addition, the second polishing unit 200 and the measuring device 300 may be physically integrated in some examples. For example, a contact sensor may be provided at the tip end of a pressing member 294 so that a projection portion P on the wafer W may be detected.

FIGS. 5 to 9 are schematic diagrams showing aspects related to control of the contact region between the polishing pad 240 and the wafer W in the second polishing unit 200 according to the present embodiment. In FIGS. 5 to 9, the contact region control unit 290 is omitted in order to simplify the description.

First, a case in which the size of the contact region between the polishing pad 240 and the wafer W is controlled in by varying the number of the pressing members 294 pressed against the polishing pad 240 will be described. In general, the smaller the number of pressing members 294 pressed against the polishing pad 240, the smaller the contact region will be. For example, when the width of the projection portion P of the wafer W is small as depicted in FIG. 5, just two pressing members 294 are used to press the polishing pad 240 P.

Figure 5:
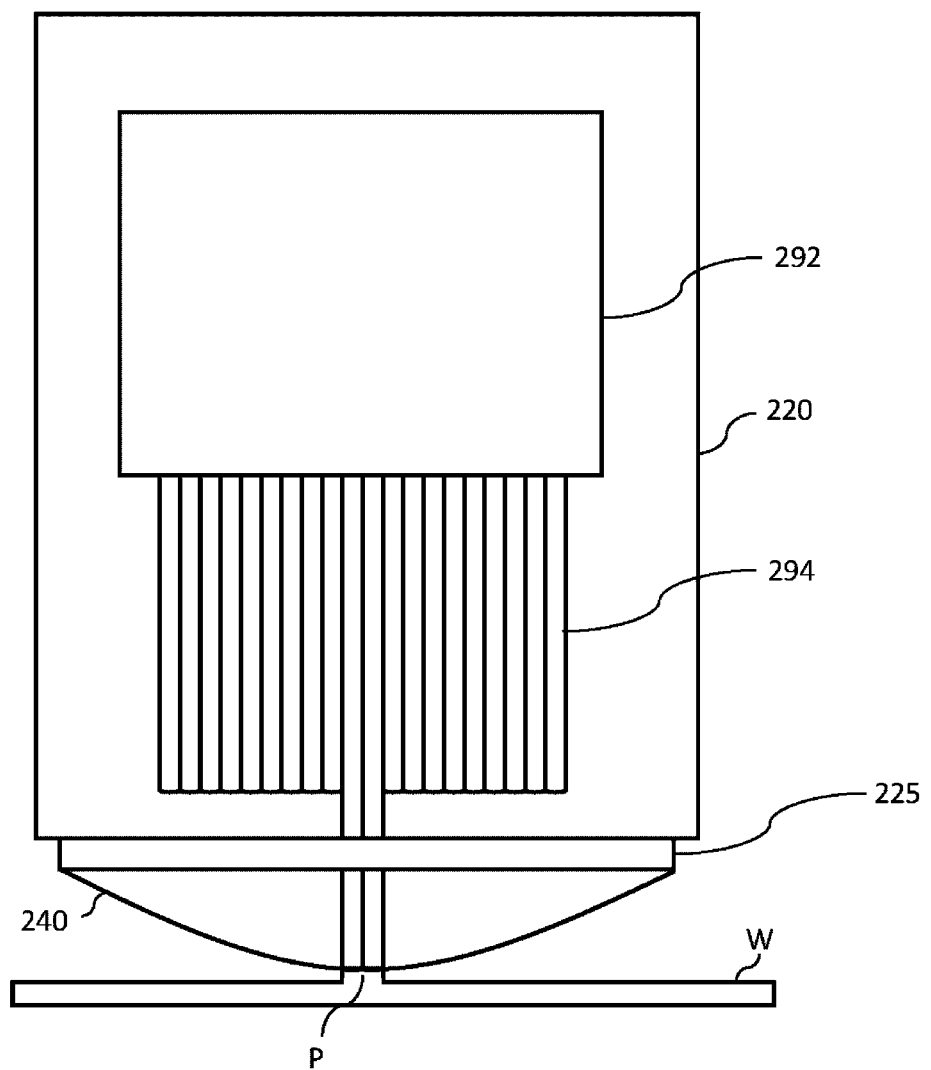
FIG. 5 is a schematic diagram depicting aspects related to control of a contact region between a polishing pad and a wafer in a second polishing unit of a polishing device according to an embodiment.
Figure 6:
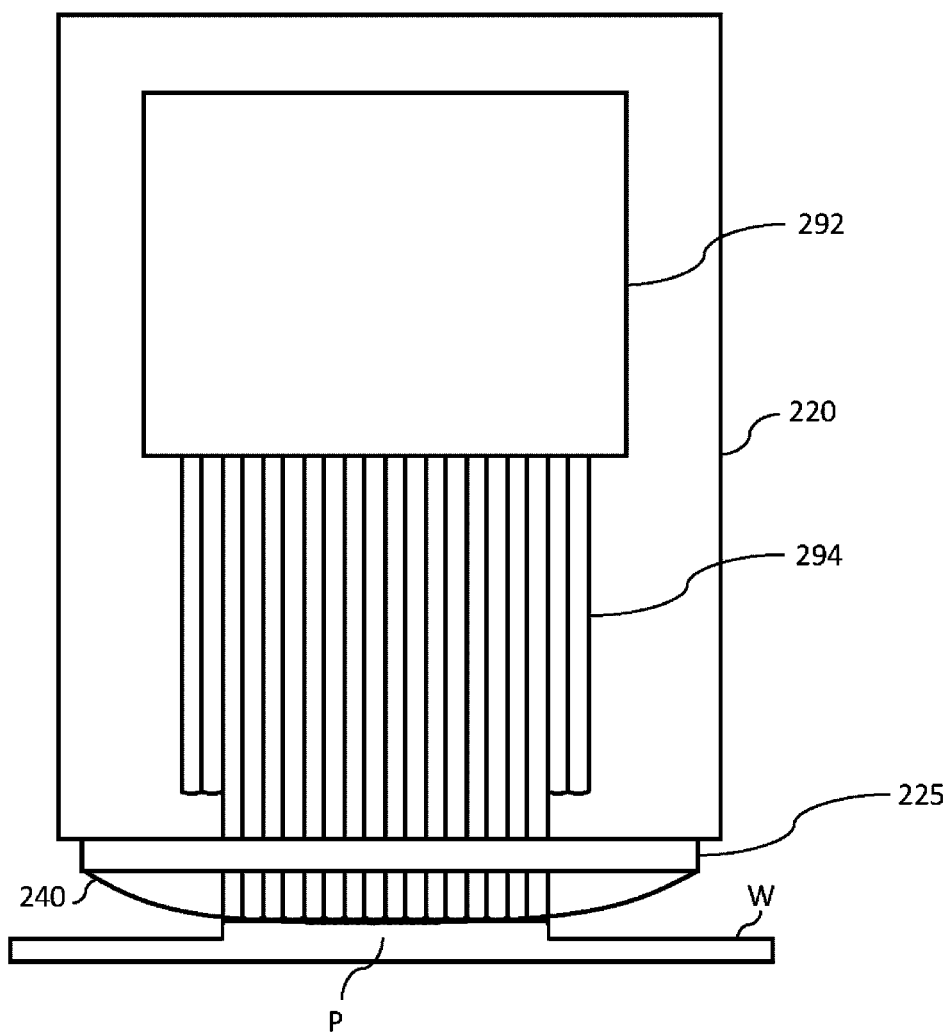
FIG. 6 is a schematic diagram depicting aspects related to control of a contact region between a polishing pad and a wafer in a second polishing unit of a polishing device according to an embodiment.

On the other hand, in FIG. 6, a greater number of pressing members 294 are pressed against the polishing pad 240, because the width of the projection portion P is greater than in FIG. 5. For example, as shown in FIG. 6, when the width of the projection portion P of the wafer W is larger, 16 pressing members 294 are extended to press the polishing pad 240 against the wafer W.

Figure 7:
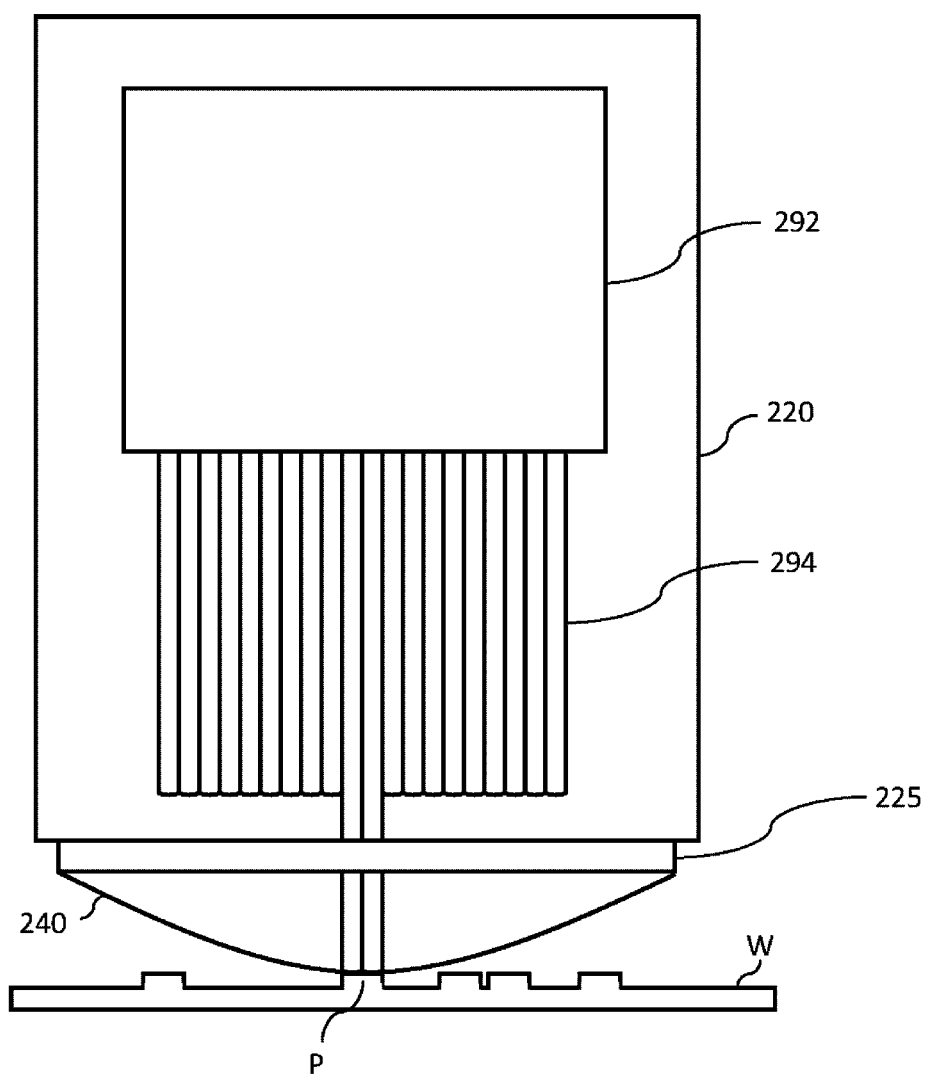
FIG. 7 is a schematic diagram depicting aspects related to control of a contact region between a polishing pad and a wafer in a second polishing unit of a polishing device according to an embodiment.

As shown in FIG. 7, when there are several distinct projection portions P scattered over the surface of the wafer W, the second polishing unit 200 is operated to polish the projection portions P one by one (or substantially so). That is, the control unit 400 controls the horizontal position of the second polishing unit 200 in accordance with the positions of each projection portion P. In addition, in this instance, the control unit 400 controls the contact region between the polishing pad 240 and the wafer W to approximately correspond to the size of each of the different projection portions P.

Figure 8:
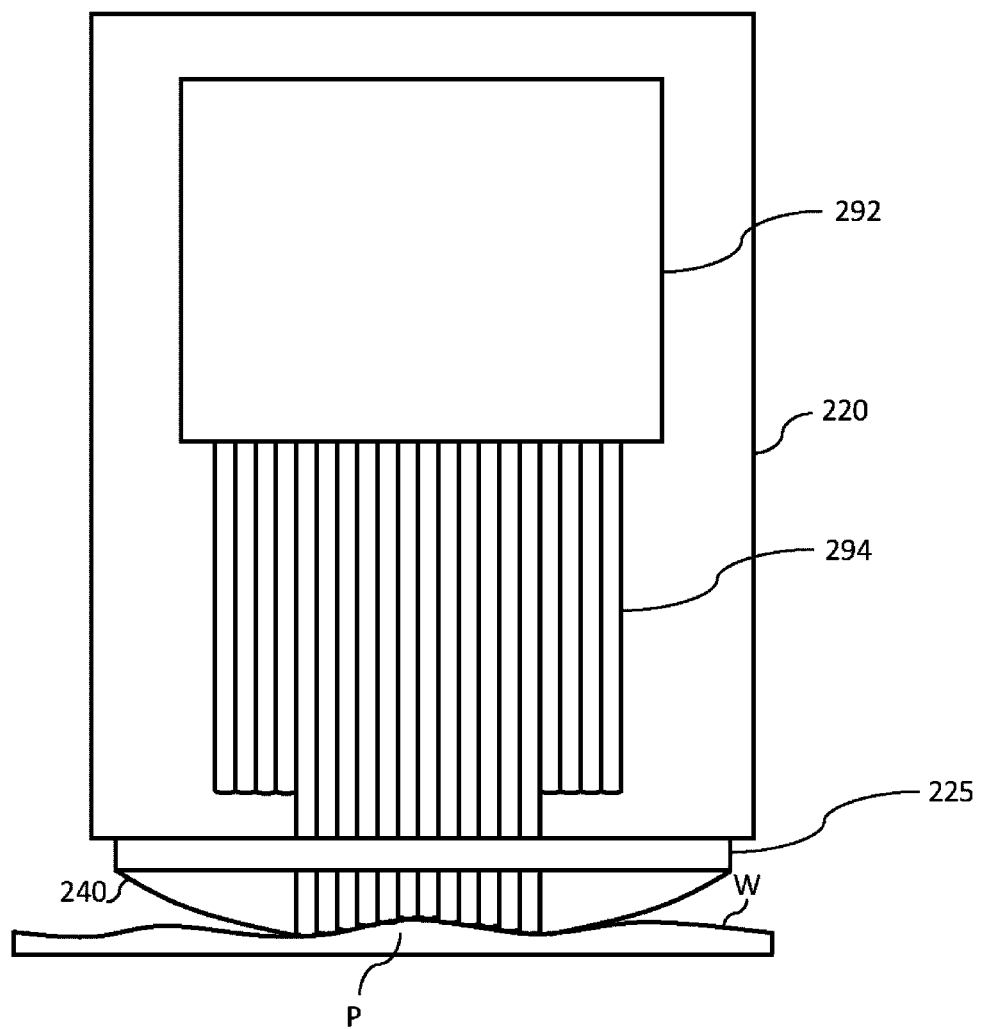
FIG. 8 is a schematic diagram depicting aspects related to control of a contact region between a polishing pad and a wafer in a second polishing unit of a polishing device according to an embodiment.
Figure 9:
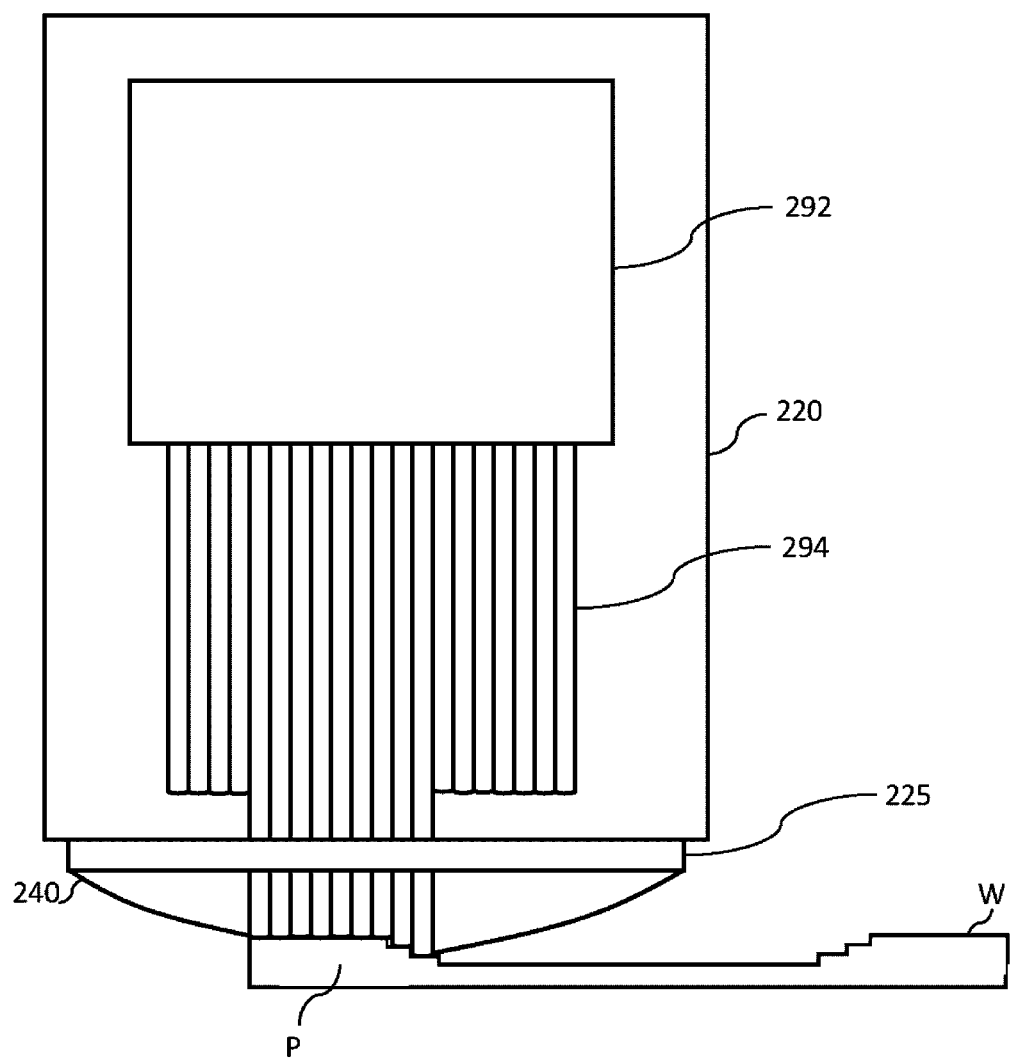
FIG. 9 is a schematic diagram depicting aspects related to control of a contact region between a polishing pad and a wafer in a second polishing unit of a polishing device according to an embodiment.

Next, a case where the contact between the polishing pad 240 and the wafer W is controlled according to the depths to which the pressing members 294 are extended will be described. FIG. 8 is a schematic diagram when the entire surface of the wafer W has undulations. FIG. 9 is a schematic diagram depicting a case in which the outer edge of the wafer W is thicker than an interior of the wafer W (that is, the wafer W is "dished" or "dish-shaped").

FIGS. 8 and 9 depict the second polishing unit 200 measuring the shape and position of a projection portion P by pressing the plurality of pressing members 294 against the surface of the wafer W. The control unit 400 controls the depth to which each pressing member 294 extends toward the polishing pad 240 and the difference in depth matches the local shape of the wafer W. For FIGS. 8 and 9, the measuring device 300 could be considered as provided as a part of the second polishing unit 200. In addition, a contact sensor (not separately depicted) is provided at the tip end of each pressing member 294. The driving unit 292 drives each pressing member 294 based on the measurement result from the measuring device 300. The measurement result corresponds to the shape of the projection portion(s) P on the wafer W.

As described above, the contact region control unit 290 may control the depth to which each pressing member 294 extend towards the polishing pad 240 in accordance with the measurement of the projection portion(s) P in addition to the number of individual pressing members 294 that are extended.

In addition, the load applied (pressing force) by each pressing member 294 can be varied according to the type of the polishing pad 240. Therefore, a condition (recipe) according to the type of polishing pad 240 may be stored in the storage unit 430.

In a polishing unit of a comparative example, a disk-shaped wafer W is sandwiched between two retainer rings (guide), and generally the polishing pad cannot be pressed against an outer edge region of the wafer W. Therefore, only the central region of the wafer W is polished and thus the polished wafer W has a recessed shape (dish shape). In some conventional systems, the projection portion(s) P in the central region of the wafer W may be polished by the pressing of an airbag, however, there is still a problem that it is difficult to polish the projection portion(s) P in the outer edge region.

In the second polishing unit 200 of the present embodiment, the contact region between the polishing target film and the polishing surface 240a may be controlled according to the measured or otherwise determined width of the projection portion(s) P. Therefore, it is possible to perform polishing according to the position and shape of the projection portion(s) P on the wafer W without exchanging the top ring 220 for a different size.

In the polishing device 1000 of the present embodiment, it is possible to perform film thickness correction of the wafer W by performing partial (local) polishing at the second polishing unit 200 after the overall polishing in the first polishing unit 100.

In addition, the driving unit 292 of the second polishing unit 200 can be utilized to selectively press the polishing pad 240 against the projection portion(s) P according to the measured size and shape of the projection portion (s) P on the surface of the wafer W. Therefore, a selected region on the wafer W may be polished to smooth/remove the projection portion P. As a result, polishing at high speed and with high accuracy may be performed in accordance with the shape and position of the uneven portion on the surface of the wafer W, so that manufacturing yield of semiconductor devices obtained from the wafer W may be improved.

Furthermore, since it is possible to locally polish the selected regions on the wafer W, it is possible to provide a semiconductor wafer that achieves better planarization of across the entirety of its surface than a semiconductor wafer that has been polished using only the polishing unit of the comparative example. Thus, in some examples, a higher product standard for a semiconductor integrated circuit may be provided. Furthermore, by providing a better planarized layer, it is possible to manufacture a semiconductor integrated circuit with an increasing number of stacked device layers or the like.

A polishing device 1000 according to the present embodiment may also be used for processing metal substrates or glass substrates for semiconductor devices or other applications.

Polishing Method and Method of Manufacturing Semiconductor Device According to Present Embodiment Next, a polishing method and a method of manufacturing a semiconductor device according to the present embodiment will be described.

Figure 10:
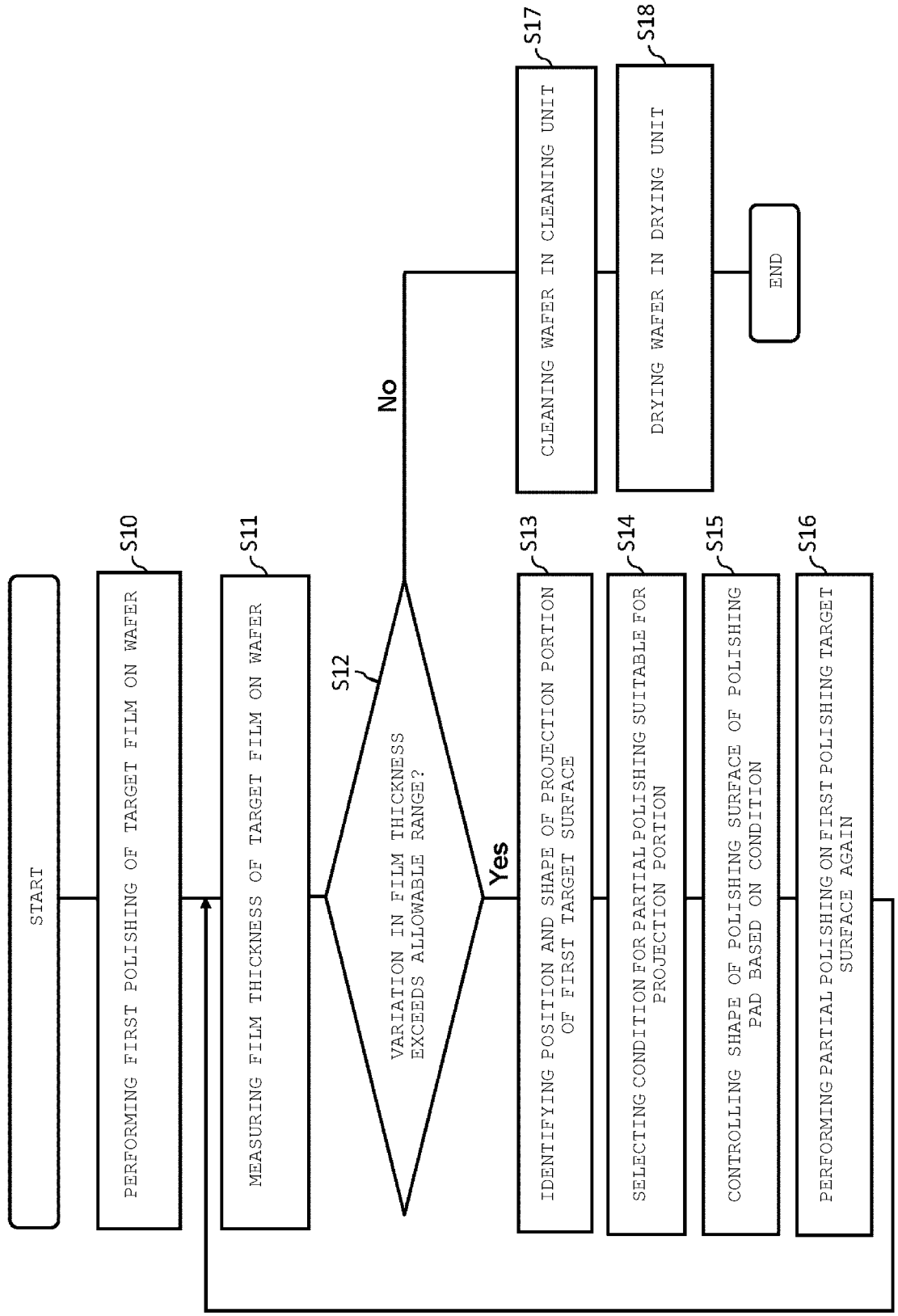
FIG. 10 is a flowchart depicting aspects of a polishing method according to an embodiment.

FIG. 10 is a flowchart showing an example of a procedure of the polishing method according to the present embodiment.

(Process S10: Performing First Polishing of Target Film on Wafer)

The wafer W on which a wiring pattern has already been formed by another device is placed on the load port 510 while being accommodated in a FOUP or a cassette. The wafer W is taken out of the FOUP or the cassette by a conveyance robot 522 that may move along the conveyance path 524. The wafer W is carried into the first polishing unit 100. The wafer W optionally may be temporarily stored in the substrate station 530 prior to being loaded into the first polishing unit 100. The entire surface of the wafer W is polished in the first polishing unit 100. In this manner, first polishing of the target film on the wafer W is performed. In the present embodiment, a case where the entire surface is polished as the first polishing of the wafer W has been primarily described, however, in some examples, the process may proceed to process S11 after only partial polishing of the wafer W.

(Process S11: Measuring Film Thickness of Target Film on Wafer)

The first polished wafer W is carried into the measuring device 300 by a conveyance robot 522. The film thickness of the target film on the wafer W is measured by the measuring device 300.

Figure 11:
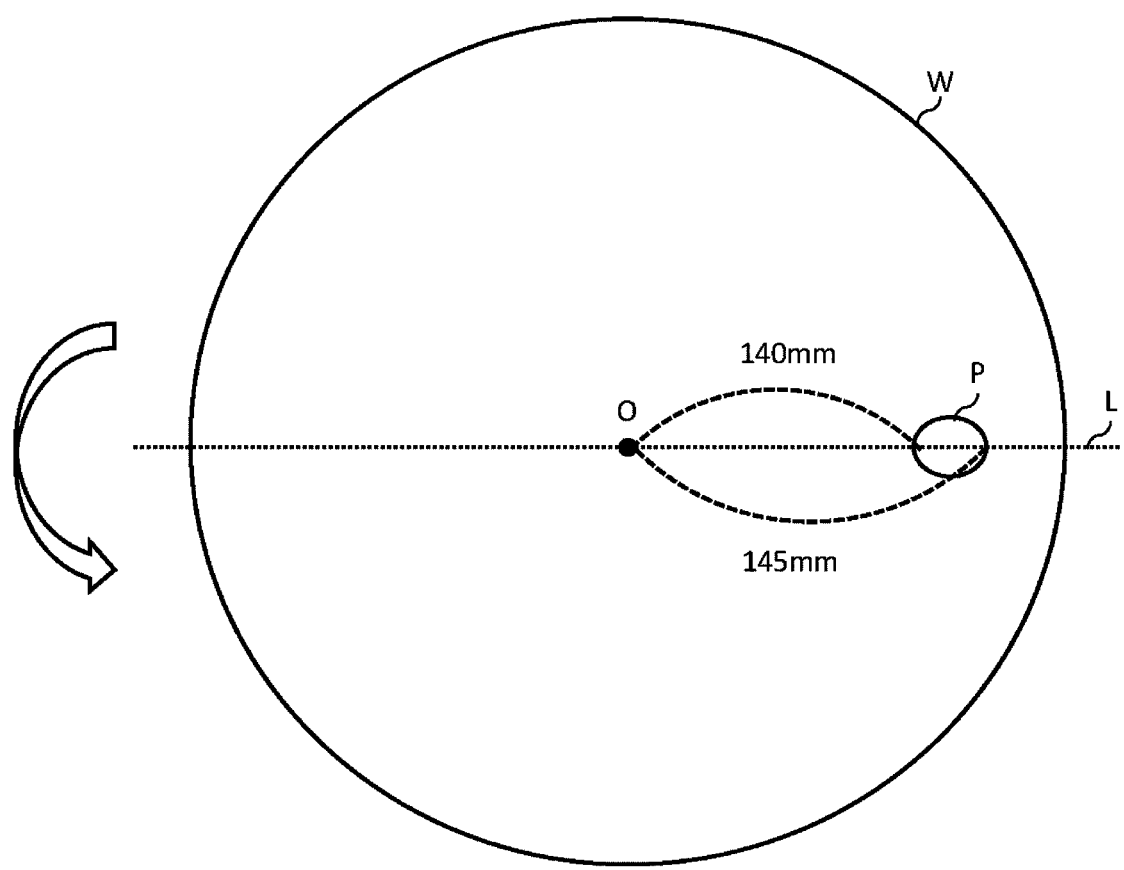
FIG. 11 is a schematic diagram depicting aspects of measuring device operations according to an embodiment.

FIG. 11 is a schematic diagram showing an example of an operation of the measuring device 300 according to the present embodiment. In the following description, a case of measuring the film thickness on the disk-shaped wafer W shown in FIG. 11 will be described. A wafer W shown in FIG. 11 has a projection portion P having a film thickness exceeding some allowable range. The projection portion is positioned on a reference line L 140 mm to 145 mm away from the center O of the wafer W. The allowable range of the film thickness is stored in the storage unit 430 in advance. The allowable range is an arbitrary setting by the user. For example, the allowable range may be set by the user so as to reflect a margin of error that is within ±5% from a target value for the film thickness.

Scanning of an optical sensor in the measuring device 300 is performed along the reference line L passing through the center O of the wafer W. In order to measure the entire surface of the wafer W with an emphasis on measurement accuracy, the measurement may be performed while the wafer W is rotated or the like. In addition, the measurement may be performed in a state where the wafer W is not rotated with an emphasis on the measurement efficiency. When measuring the entire surface of the wafer W, the measurement process is continued until the wafer W rotates at least once. In this manner, the film thickness of the target film on the wafer W is measured by the measuring device 300. The measurement result is transmitted to the control unit 400 via the bus 560.

(Process S13: Identifying Position and Shape of Projection Portion of First Polishing Target Surface)

The control unit 400 receives a measurement result related to the film thickness of the target film on the wafer W from the measuring device 300. Next, the operation unit 440 calculates information related to the surface state of the wafer W based on the received measurement result.

Figure 12:
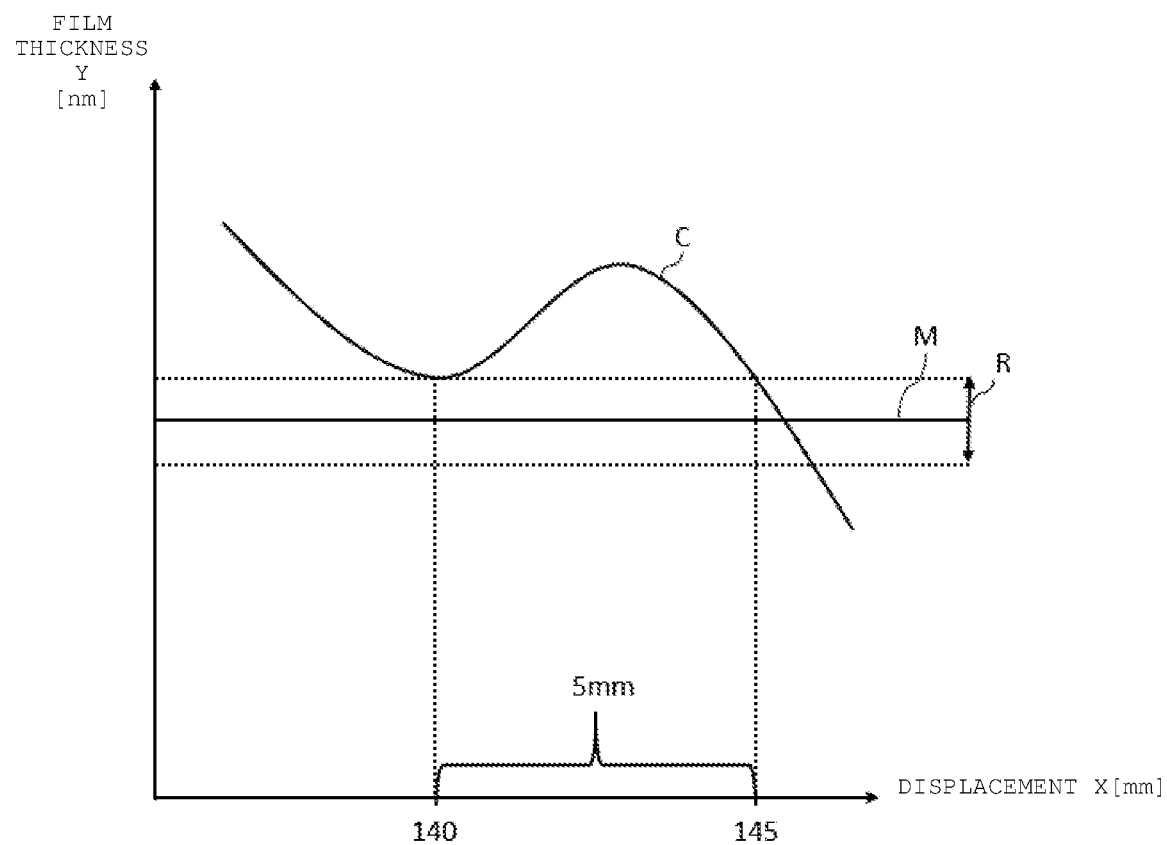
FIG. 12 depicts a relationship between a displacement from a center of a wafer and a film thickness measured by a measuring device according to an embodiment.

FIG. 12 is a graph depicting an example relationship between a displacement from a center O of the wafer W and the film thickness obtained by measurement by the measuring device 300.

For example, the operation unit 440 creates a graph showing the relationship between the distance from the center O of the wafer W and the measured film thickness, based on the measurement result obtained by scanning the film thickness sensor. From the measurement result of the film thickness of the polishing target film of the wafer W shown in FIG. 11, a curve C for which an X axis is displacement from center and a Y axis is the film thickness is obtained as shown in FIG. 12. A straight line M in FIG. 12 indicates the target value for the film thickness. The range R depicted in FIG. 12 indicates the allowable range of the film thickness. For example, the range R may be set by the user so as to reflect a margin of error that is within ±5% from the target value (line M). When the curve C is above the range R, it indicates that the variation in the film thickness of the target film on the wafer W exceeds the allowable range.

As described above, when there is a portion where the variation in film thickness of the polishing target film exceeds the allowable range, partial polishing (local polishing) can be performed by the second polishing unit 200 based on the measurement result (Yes for S12). The wafer W is carried into the second polishing unit 200 by a conveyance robot 522 after the measurement processing, if necessary.

If there is no portion where the variation in film thickness exceeds the allowable range, the wafer W is carried to the cleaning unit 540 by a conveyance robot 522 (No for S12).

As shown in FIG. 12, it can be seen that the width of the projection portion P to be polished is 5 mm because the portion 140 mm to 145 mm from the center O of the wafer W exceeds the allowable range (above the range R). In this manner, the operation unit 440 identifies the position and shape of the projection portion P.

(Process S14: Selecting Condition for Partial Polishing Suitable for Projection Portion)

The operation unit 440 selects a condition (recipe) for controlling the pressing members 294. That is, the number, positions, and depths of the pressing members 294 are provided as a part of recipe from the storage unit 430, based on the position and shape of the identified projection portion(s) P on the wafer W to be processed.

Furthermore, the controller 410 transmits an operation command signal based on the selected condition (recipe) to the second polishing unit 200.

(Process S15: Controlling Shape of Polishing Surface of Polishing Pad Based on Condition)

The second polishing unit 200 receives the operation command signal from the controller 410 and moves components as necessary to position the polishing pad 240 away from the center O of the wafer W at the location where the projection portion P is present. In this example, the projection portion P is at a position 140 mm to 145 mm away from the center O. Furthermore, the driving unit 292 controls the shape of the polishing surface 240a of the polishing pad 240 by moving the particular pressing members 294 corresponding to those identified in the recipe.

(Process S16: Performing Partial Polishing on First Polishing Target Surface Again)

After controlling the shape of the polishing surface 240a according to the recipe from the control unit 400, partial polishing is performed on the first polishing target surface on the wafer W by the second polishing unit 200.

The partially polished wafer W is then carried to the measuring device 300 by a conveyance robot 522, and the film thickness of the polishing target film is measured again. The processing from S11 to S16 can be repeated until the variation in film thickness of the polishing target film falls within the allowable range.

(Process S17: Cleaning Wafer in Cleaning Unit)

Once target film on wafer W is determined by the measuring device 300 to be within the allowable range, wafer W is cleaned by the cleaning unit 540. The cleaned wafer W is then carried into the drying unit 550 by a conveyance robot 522.

(Process S18: Drying Wafer in Drying Unit)

The cleaned wafer W is dried by the drying unit 550. The dried wafer W is returned to the FOUP or cassette at the load port 510. In this manner, the chemical mechanical polishing processing is completed for the wafer W.

With the polishing method of the present embodiment, it is possible to perform feedback control by which the measurement of the surface state of the substrate by the measuring device 300, the selection of the condition for the second polishing unit 200 by the control unit 400, and the partial polishing for the substrate by the second polishing unit 200 can be repeated until the variation in the target film on the substrate falls within the allowable range, and thus over-polishing of the substrate may be prevented.

Furthermore, it is possible to perform film thickness correction at relatively high speed and with high accuracy by adjusting the contact area between the polishing target film and the polishing surface. As a result, the manufacturing yield of semiconductor devices obtained using the polishing method of the present embodiment may be improved. Furthermore, since the localized polishing of particular regions on the wafer W is possible, a higher product standard may be achieved more consistently.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A polishing apparatus, comprising:
a holder configured to hold a polishing pad for polishing a surface of a substrate;
a plurality of pressing members configured to press a back surface side of the polishing pad being held by the holder; and
a driving unit configured to selectively move pressing members in a direction towards the surface of the substrate to press the back surface side of the polishing pad being held by the holder.

2. The polishing apparatus according to claim 1, wherein the planar area of the polishing pad is less than the planar area of the surface of the substrate.

3. The polishing apparatus according to claim 1, wherein each pressing member is connected to an electrical actuator or an air cylinder.

4. The polishing apparatus according to claim 1, wherein each pressing member is a rod-like member having a rounded end.

5. The polishing apparatus according to claim 1, wherein at least one pressing member in the plurality of pressing members includes a sensor for detecting contact with the substrate.

6. The polishing apparatus according to claim 5, further comprising:
a measuring device configured to measure a film thickness of a film on the substrate.

7. The polishing apparatus according to claim 6, wherein the measuring device comprises an optical sensor, contact sensor, or eddy-current sensor.

8. The polishing apparatus according to claim 6, wherein the measuring device is configured to provide a position and a height of a protrusion on the surface of the substrate.

9. The polishing apparatus according to claim 8, wherein the measuring device is configured to compare the height of the protrusion to a target value.

10. The polishing apparatus according to claim 1, further comprising:
a measuring unit configured to measure a film thickness of a film on the substrate;
an arithmetic unit configured to identify a position and a height of a protrusion on the surface of the substrate based on the measurement of the film thickness and then select a recipe for polishing the protrusion from among a plurality of recipes stored in a storage unit, wherein
the driving unit is controlled to selectively move the pressing members according to the selected recipe.

11. A polishing apparatus, comprising:
a measuring device configured to measure a film thickness of a film on a substrate;
an arithmetic unit configured to identify a position and a height of a protrusion on the surface of the substrate based on the measurement of the film thickness and then select a recipe for polishing the surface of the substrate according to the position and height of the protrusion;
a holder configured to hold a polishing pad for polishing the surface of the substrate;
a plurality of pressing members configured to press a back surface side of the polishing pad being held by the holder and vary a polishing surface of the polishing pad that contact the surface of the substrate during polishing; and
a driving unit configured to selectively move pressing members in a direction towards the surface of the substrate to press the back surface side of the polishing pad being held by the holder, wherein
the driving unit is controlled according to the selected recipe to selectively move pressing members in the direction towards the surface of the substrate during the polishing of the surface of the substrate.

12. The polishing apparatus according to claim 11, wherein the measuring device is configured to compare the height of the protrusion to a target value.

13. The polishing apparatus according to claim 11, wherein the recipe indicates which pressing members in the plurality of pressing members are moved and to what distance to which the pressing members in the plurality of pressing members are extended.

14. The polishing apparatus according to claim 11, wherein each pressing member is connected to an electrical actuator or an air cylinder.

15. The polishing apparatus according to claim 11, wherein each pressing member is a rod-like member having a rounded end.

16. The polishing apparatus according to claim 11, wherein the measuring device comprises an optical sensor, contact sensor, or eddy-current sensor.

17. The polishing apparatus according to claim 11, wherein the arithmetic unit is configured to prepare a graph indicating measured film thickness on the substrate at various points on the substrate.

18. The polishing apparatus according to claim 17, wherein the arithmetic unit is configured to identify the location and the height of the protrusion on the surface of the substrate by using the graph.

19. A substrate manufacturing method, comprising:
bringing a polishing pad into contact with a surface of a substrate, wherein
the polishing pad being held by a polishing apparatus, comprising:
a holder configured to hold the polishing pad for polishing the surface of the substrate;
a plurality of pressing members configured to press a back surface side of the polishing pad being held by the holder; and
a driving unit configured to selectively move pressing members in a direction towards the surface of the substrate to press the back surface side of the polishing pad being held by the holder.

20. The method of claim 19, further comprising:
fabricating a semiconductor device on the substrate.

* * * * *